United States Patent [19]
Igarashi et al.

[11] Patent Number: 5,829,722
[45] Date of Patent: Nov. 3, 1998

[54] ELECTRIC COMPONENT HOLDER AND MECHANISM OF SECURING THE SAME

[75] Inventors: Osamu Igarashi; Takeshi Hirakawa, both of Kanagawa, Japan

[73] Assignee: Nikko Kogyo Kabushiki Kaisha, Kanagawa, Japan

[21] Appl. No.: 701,149

[22] Filed: Aug. 21, 1996

[30] Foreign Application Priority Data

Aug. 21, 1995 [JP] Japan .................................. 7-212238

[51] Int. Cl.⁶ .................................................. A47B 96/06
[52] U.S. Cl. ...................................................... 248/222.12
[58] Field of Search ..................... 248/222.12, 223.31, 248/224.8, 226.11, 71, 222.13, 225.11, 229.1

[56] References Cited

U.S. PATENT DOCUMENTS

| | | |
|---|---|---|
| 3,874,766 | 4/1975 | Mizusawa . |
| 4,143,577 | 3/1979 | Eberhardt .............................. 248/71 X |
| 4,312,487 | 1/1982 | Kimura ..................... 248/73 |
| 4,867,599 | 9/1989 | Sasajima ........................ 248/222.12 X |
| 4,974,798 | 12/1990 | Harding et al. ................ 248/222.12 X |
| 5,288,530 | 2/1994 | Maki . |

FOREIGN PATENT DOCUMENTS

| | | |
|---|---|---|
| S49-40556 | 11/1974 | Japan . |
| S56-34108 | 4/1981 | Japan . |
| S57-171482 | 10/1982 | Japan . |
| S59-26634 | 8/1984 | Japan . |
| S63-5605 | 2/1988 | Japan . |
| H2-940 | 1/1990 | Japan . |
| H2-31570 | 7/1990 | Japan . |
| H2-29291 | 8/1990 | Japan . |
| H2-46070 | 12/1990 | Japan . |
| H3-25643 | 4/1991 | Japan . |
| H7-23608 | 5/1995 | Japan . |
| 469375 | 7/1937 | United Kingdom . |
| 1284443 | 8/1972 | United Kingdom . |
| 2087968 | 6/1982 | United Kingdom . |
| 2106335 | 4/1983 | United Kingdom . |
| 2153897 | 8/1985 | United Kingdom . |

OTHER PUBLICATIONS

Catalogue Published by Nikko Kogyo Kabushiki Kaisha in May, 1992, p. 40 and Table of Contents.

*Primary Examiner*—Ramon O. Ramirez
*Attorney, Agent, or Firm*—Sterne, Kessler, Goldstein & Fox P.L.L.C.

[57] ABSTRACT

The present invention provides a widely applicable electric component holder and a mechanism for securing this electric component holder. It enables attachment of an electric component to a receiving member without protruding on the back face of the receiving member and which allows simple attachment to and detachment from the receiving member. This electric component holder includes a holding portion for holding an electric component and a securing portion for securing this holding portion on the receiving member, and this securing portion includes engaging claws 40, 42 and 44 which are inserted into a hole opened into one face of the receiving member in a parallel direction to the receiving member face, in a direction parallel to the receiving member face, thereby engaging releasably with the installation portion.

11 Claims, 19 Drawing Sheets

F I G. 8 a
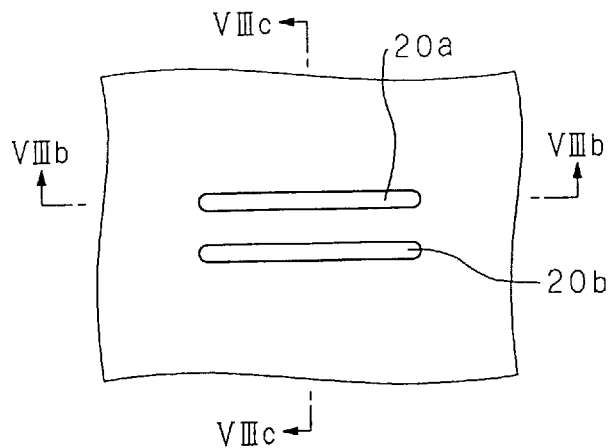
F I G. 8 b
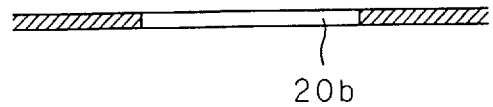
F I G. 8 c
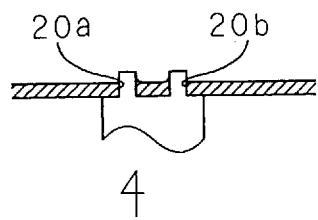

F I G. 34
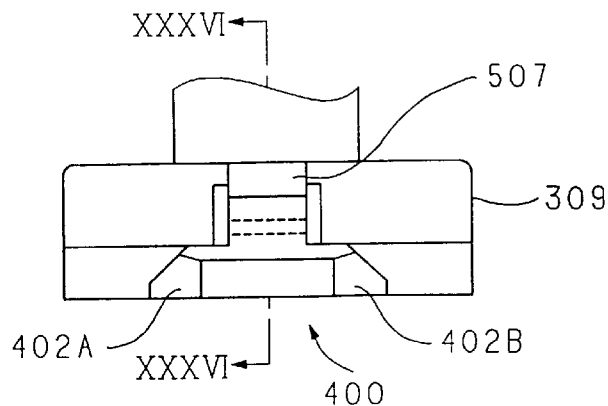
F I G. 35
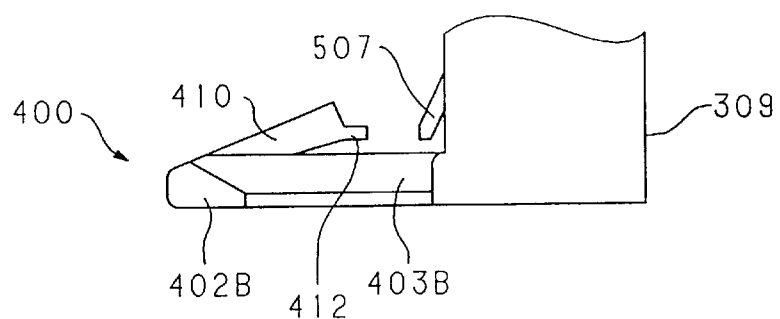
F I G. 36
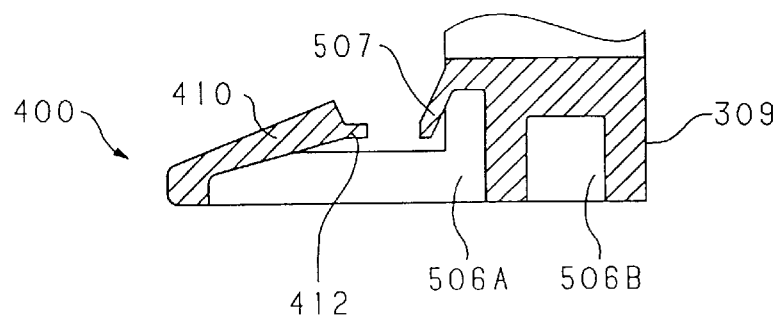

ELECTRIC COMPONENT HOLDER AND MECHANISM OF SECURING THE SAME

BACKGROUND OF THE INVENTION

1. Field of the Invention

The present invention relates to a tool for holding electric components, and a mechanism for securing the tool. In particular, the present invention is concerned with a tool and a mechanism for securing electric components such as printed plate boards or cables in a stable state while holding them at a predetermined distance to a receiving member such as a chassis or a panel.

2. Description of the Related Art

Conventionally, a variety of electric component holders have been used for efficient utilization of the space inside electric appliances. Such holders were used for insulating internal electric components (e.g., printed plate boards, cords, etc.), by securing them at predetermined distances to the receiving member (e.g., a chassis or a panel) of the electric device. These conventional electric component holders normally include a means for holding the electric component at one end of a column of predetermined length, while the other end includes a securing portion for securing the component to a board. The electric component holder is secured to the receiving member by inserting the securing portion into a securing hole in the receiving member.

Specifically, FIG. 1 shows an example of a conventional electronic component holder wherein a board 110 functions as the receiving member for securing the electric component holder thereon, having mounted thereon a securing portion 130 which clamps onto the board 110 from either side through a securing hole 112 bored in advance through the board, and a holder 120 positioned opposite to securing portion 130 at a predetermined distance for holding an electric component by a predetermined method.

Securing portion 130 is composed of a firmly oppressing piece 116 with its flank having an arch-shaped cross section, which firmly supports the face of the board 110 (hereinafter referred to as the "front face") which will hold the electric component 118, a joining board 113 extending from the center of the oppressing piece 116, and a resilient, arrowhead-shaped counter-oppressing piece 114 which is formed on the tip of the joining board 113 and which passes through the securing hole 112 from the front face to firmly support the back side of the board 110 (hereinafter referred to as the "back face.") In other words, this securing portion 130 functions to be fixed to the board 110 by clamping the board 110 from both sides via the oppressing piece 116 and the resilient counter-oppressing piece 114 which has passed through the supporting hole 112.

The problem with this type of conventional electric component holder is the difficulty of making electric devices compact, as space is required on the back face of the board 110 in order to house the resilient counter-oppressing piece 114 projecting from the back face of the board 110. Moreover, this projection does not look good, harms the outward appearance of the electric appliance greatly, and is a source of-potential injury to maintenance workers who may scratch their hands on or bend the electric component holder. Therefore, it is desirable to minimize the length of the protruding portion.

However, there is a limit to minimizing the length of this protrusion because this type of electric component holder requires the insertion of the resilient counter-oppressing piece 114 into the securing hole 112 and the oppression of the back face of the board 110 by utilizing the resilient recovery of the resilient counter-oppressing piece 114.

Patent Publication (Kokoku) Sho 63(1988)-5605 discloses an electric component holder of the known art which has minimized the length of the portion of the board 110 which protrudes from the back face. As shown in FIG. 2, this electric component holder has a larger diameter than the securing hole bored through the board 110 in advance, and comprises an umbrella-shaped, thin, resilient counter-oppressing piece 214 for oppressing the back face of the board 110, a resilient oppressing piece 215 which recovers after passing through the securing hole 112 of the board 110 from the back face and is placed at a distance from the resilient counter-oppressing piece 214 by the width of the board 110, a securing portion 216 having a stepped portion 226 which is positioned between the resilient counter-oppressing piece 214 and the resilient oppressing piece 215 and which is brought into engagement with the securing hole 112 after passing through the securing hole 112 and the resilient oppressing piece 215 recovering, and a holding portion 220 which is positioned opposite to the securing portion 216 at a predetermined distance and which holds the electric component 118 by a predetermined method.

This electric component holder is structured so as to be attached to board 110 by causing holding portion 220, resilient counter-oppressing piece 214, and stepped portion 226 to pass through securing hole 112 from the back face of the board 110. This offers the advantage that the length of the resilient counter-oppressing piece 214 protruding from the back face of board 110 can be made very small, as it only needs to function to oppress the back face of the board 110.

However, the electric component holder disclosed in Patent Publication (Kokoku) Sho 63(1988)-5605 requires a structure which enables the holder 220 to pass through the securing hole 112 from the back face of the board 110. This reduces the versatility of the electric component holder. While the size of the securing hole 112 may be changed to fit the shape of holding portion 220, the problem remains that the diameter of the resilient oppressing piece 216 must be enlarged in accordance with the size of the securing hole 112. As the size of securing hole 112 may differ over a variety of values, there is the problem that the manufacturing process of securing hole 112 will become costly and difficult. It is also difficult to remove the electric component holder from the board 110 once it has been secured thereon.

Another problem is that the productivity is reduced by the necessity of setting the width between resilient counter-oppressing piece 214 and resilient oppressing piece 216 in correspondence with the width of board 110. Patent Publication (Kokai) Hei 7(1995)-23608 discloses an improvement which, however, creates the additional problem that the protrusion cannot be completely removed from the back face of the board, and the problems related to the electric component holder shown in FIG. 1 cannot be fully resolved.

In addition, people have recently recommended that equipment and material be recycled, so that easy removal of the electric component holder is becoming an issue. Conventionally shaped electric component holders complete their insertion and setting operation by an insertion operation from one direction, but as the removal is performed from the back face of the board (chassis), depending on the accessibility of the back face, the removal may be difficult and problematic.

Furthermore, conventional electric component holders rotate around an axis vertical to the board surface when being secured on the board, so that it is difficult to position the electric components in one constant direction. Therefore, measures are being taken among others to form the securing hole of the board as quadrangles or other polygons, and to shape the electric component holder in correspondence with this securing hole.

SUMMARY OF THE INVENTION

The object of the present invention is to solve the conventional problems cited above by providing an electric component holder with a high degree of versatility, which does not protrude from the attachment component and can be easily attached and detached from the attachment component, and an attachment mechanism for securing this electric component holder.

In order to achieve this aim, the present invention provides an electric component holder to be secured a receiving member comprising a holding means for holding an electric component, and a securing portion for securing the holding means to the receiving member, the securing portion including a body and an engaging portion on the body, the engaging portion being releasably engaged with an installation portion formed on one face of the receiving member.

An installation portion includes a hole, which opens in a direction parallel to the face of the receiving member and the engaging portion is inserted in the hole.

A combining member may be positioned between the holding means and the securing portion to combine both at a predetermined distance. The holding means may also be formed integrally with the holding portion.

Furthermore, the engaging portion may be provided with an engaging claw at its tip which retires when inserted into said hole and recovers when extending past the hole to engage with said installation portion.

The engaging claw may also retire and recover resiliently with the base end of said engaging portion operating as a fulcrum.

The engaging portion may further be provided with guide pieces on both sides of said engaging claw which project in a horizontal direction from that face of the body which has the engaging portion thereon, the guide pieces guiding the engaging portion during insertion into said hole, and exerting pressure on the inner wall of said installation portion when the engaging portion has engaged with the installation portion.

The engaging portion may further include an engaging portion body extending in a horizontal direction from the body, and an engaging claw extending upward at a narrow angle from the tip to the base of the engaging portion body, made from the central portion in widthwise direction of the engaging portion body, and retiring or recovering resiliently with the tip of the engaging portion body operating as a fulcrum.

A pressing portion may also be mounted on that face of the body which has the engaging portion thereon, the pressing portion exerting pressure on the outer wall of the installation portion in the direction of the engaging claw.

The present invention further provides an installation portion for installing an electric component holder on a receiving member, including an installation supporter formed on the receiving member to project in a substantially vertical direction to the front face of the receiving member, and which defines together with the surface of the receiving member a first hole open in one direction parallel to the surface, and a second hole bored at a position opposite to said installation supporter of the receiving member, the second hole being formed to extend over both sides of the installation supporter in the direction in which it opens.

The present invention also provides a mechanism for securing an electric component holder, including an electric component holder for holding an electric component, and a receiving member whereon the electric component holder is secured, the receiving member including an installation supporter formed to project in a substantially vertical direction to the front face of the receiving member and which defines together with the front face of the receiving member a first hole open in one direction parallel to the front face, and a second hole bored at a position opposite to said installation supporter of the receiving member and extending over both sides of the installation supporter in the direction in which it opens, wherein said electric component holder includes an engaging portion which is releasably inserted into said first hole in the direction parallel to the receiving member face to be pressed by the inner wall of the installation supporter and which thereby engages with the installation supporter to be releasable in the insertion direction.

The installation portion is also formable with such steps as, for example, boring two parallel holes separated by a distance which corresponds to the width of the installation portion, and pressing the portion between both holes upward from one face of the receiving member and subjecting the portion to a drawing process.

DESCRIPTION OF THE DRAWINGS

FIG. 8(a) is a planar view showing a portion of the process for forming the attachment portion on the chassis relating to an embodiment of the present invention.

FIG. 8(b) is a sectional view of the process shown in FIG. 8(a) along line VIIIb—VIIIb.

FIG. 8(c) is a sectional view of the process shown in FIG. 8(a) along line VIIIc—VIIIc.

FIG. 34 is a front elevation of the electric component holder relating to an embodiment of the present invention.

FIG. 35 is a side view of the electric component holder relating to an embodiment of the present invention.

FIG. 36 is a sectional view of the holder in FIG. 34 along line XXXVI—XXXVI.

DESCRIPTION OF THE PREFERRED EMBODIMENTS

Now, a form of working the present invention (hereinafter referred to as "embodiment") will be described with reference to the drawings. The description of the present embodiment shall concentrate on an electric component holder for holding and securing a printed plate board at a predetermined distance to the chassis of the electric device.

Figure 1:
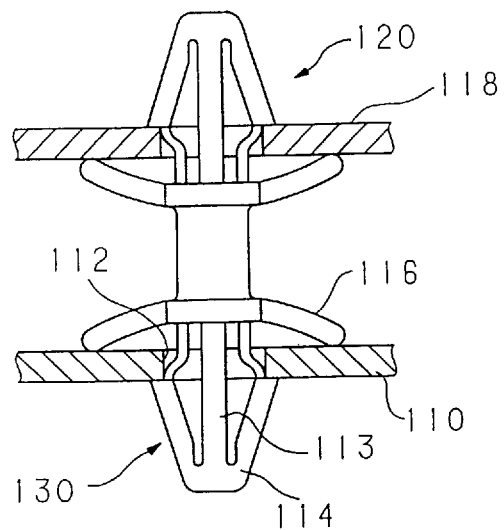
FIG. 1 is a front elevation of a conventional electric component holder with a partial, sectional cutout.
Figure 2:
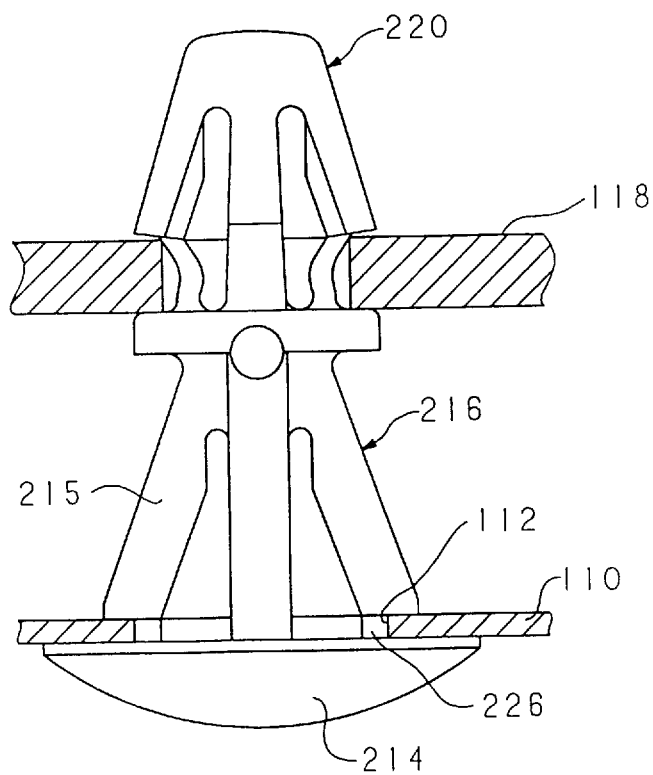
FIG. 2 is a front elevation of a conventional electric component hold with a partial, sectional cutout.
Figure 3:
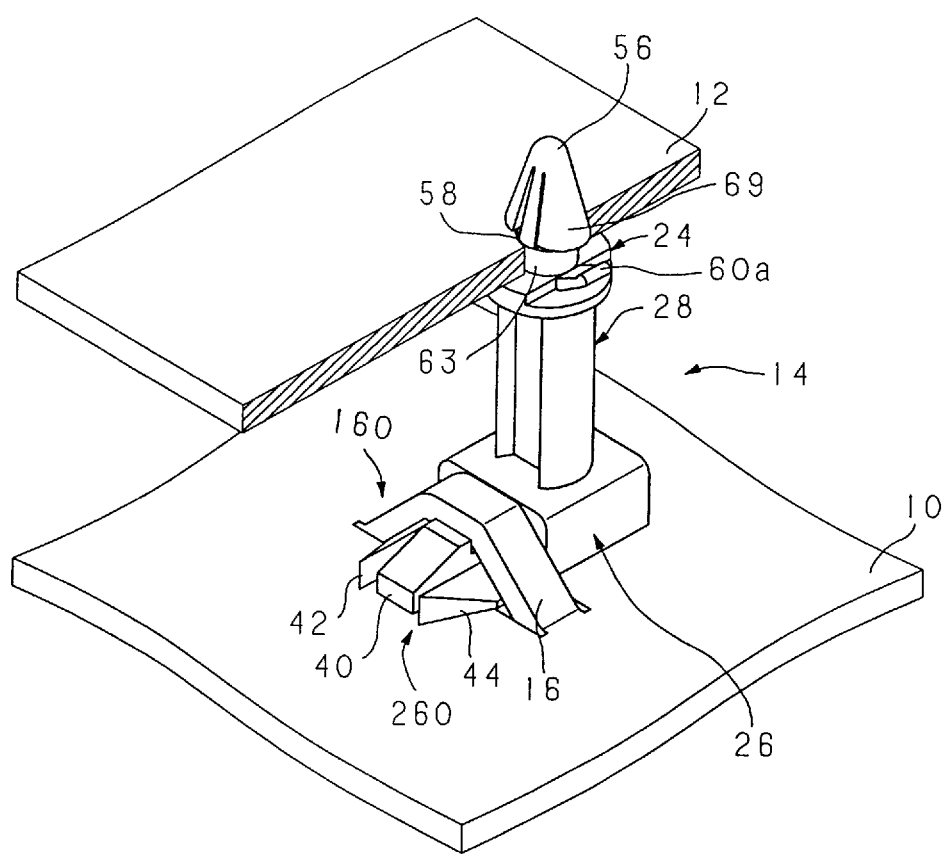
FIG. 3 is a perspective view of an embodiment of the electric component holder according to the present invention during use, with a partial, sectional cutout.
Figure 4:
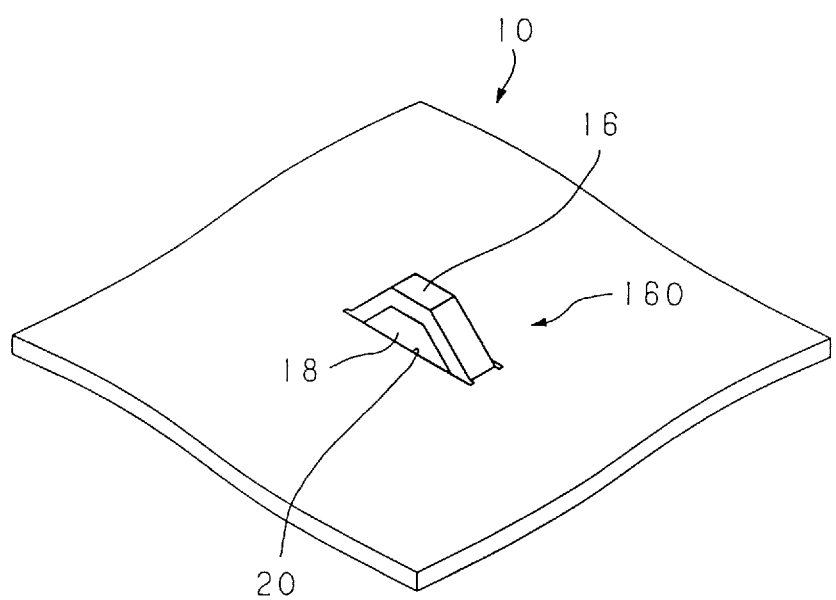
FIG. 4 is a perspective view of the chassis upon which the electric component holder relating to an embodiment of the present invention is to be secured.
Figure 5:
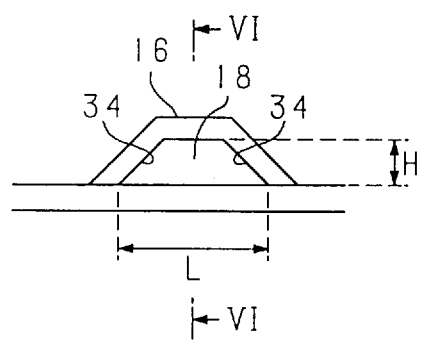
FIG. 5 is a front elevation showing a portion of the FIG. 4 chassis.
Figure 6:
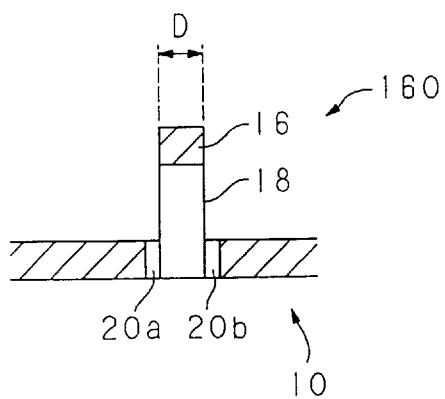
FIG. 6 is a sectional view of the chassis shown in FIG. 5 along line VI—VI.
Figure 7:
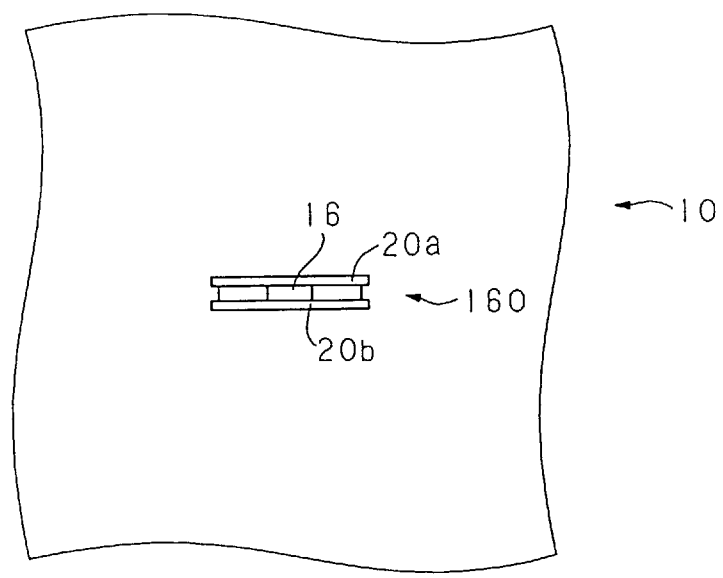
FIG. 7 is a planar view of the chassis shown in FIG. 4.

FIG. 3 is a perspective view of the electric component holder relating to the present invention during use, with a partial, sectional cutout. FIG. 4 is a perspective view showing a portion of the chassis upon which the electric component holder relating to the present embodiment is to be secured. FIG. 5 is a front elevation of part of the chassis in FIG. 4. FIG. 6 is a sectional view of the chassis in FIG. 5 along line VI—VI. FIG. 7 is a planar view of the chassis in FIG. 4.

As shown in FIGS. 3 through 7, an installation portion 160 for securing the holder thereon is formed at a position on the front face of chassis 10, where the electric component holder 14 is to be secured.

This installation portion 160 is formed to protrude in a trapezoid shape in a direction perpendicular to the front face of the chassis 10, and has an installation supporter 16 between itself and the surface of chassis 10, which defines a hole 18 opening into one direction which is parallel to the surface. Furthermore, a hole 20 is bored through opposite the installation supporter 16 on chassis 10, which has a width greater than the width D of installation supporter 16 (FIG. 6).

A portion of the inner wall (inner side) of installation supporter 16 have slanted faces 34 which are opposed to each other, whereon a predetermined portion of the attachment portion 26 of electric component holder 14 (described hereinbelow) is pressed.

This installation portion 160 may be formed by the following method. This method is, without limitation, merely an example of the method of forming installation portion 160.

Figure 9A:
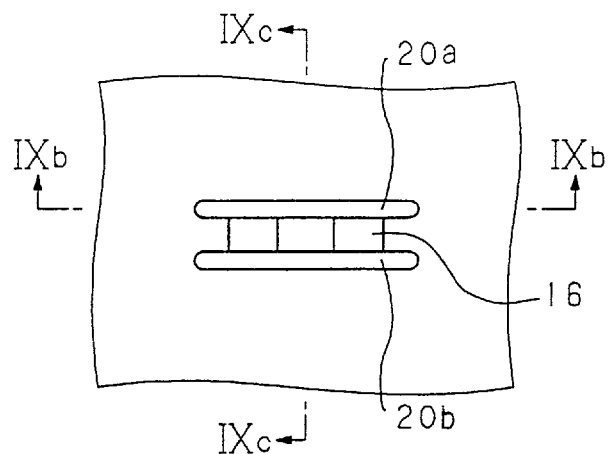
FIG. 9(a) is a front elevation showing a portion of the process for forming the attachment portion on the chassis relating to an embodiment of the present invention.
Figure 9B:
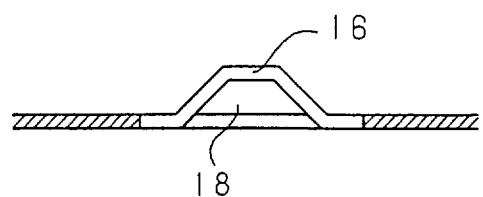
FIG. 9(b) is a sectional view of the process shown in FIG. 9(a) along line IXb—IXb.
Figure 9C:
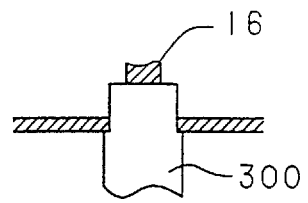
FIG. 9(c) is a sectional view of the process shown in FIG. 9(a) along line IXc—IXc.

FIG. 8(a) is a planar view showing a portion of the process for forming the installation portion 160 on the chassis 10. FIG. 8(b) is a sectional view of the process shown in FIG. 8(a) along line VIIIb—VIIIb. FIG. 8(c) is a sectional view of the process shown in FIG. 8(a) along line VIIIc—VIIIc. FIG. 9(a) is a planar view showing a portion of the process for forming the installation portion on the chassis. FIG. 9(b) is a sectional view of the process shown in FIG. 9(a) along line IXb—IXb. FIG. 9(c) is a sectional view of the process shown in FIG. 9(a) along line IXc—IXc.

First, a s shown in FIGS. 8(a)–(c), two parallel holes 20a and 20b are bored by a punching process through chassis 10 of the electric component holder 14 at their attachment positions while maintaining a distance thereinbetween which corresponds to the width D of installation supporter 16 (cf. FIG. 6). Then, a s shown in FIGS. 9(a)–(c), the portion which is to be the installation supporter 16, namely the portion between said holes 20a and 20b, is pushed upwards from the back face of chassis 10, where the electric component holder 14 is to be secured, and subjected to drawing. By making the outer shape of the mold 300 used for this drawing process a trapezoid, it is possible to process the installation supporter 16 as a trapezoid corresponding to mold 300, as shown in FIG. 9(a), and a trapezoid-shaped hole 18 can be defined. As result, hole 20 joining holes 20a and 20b will be bored at a position opposite the installation supporter 16 of chassis 10.

Figure 10:
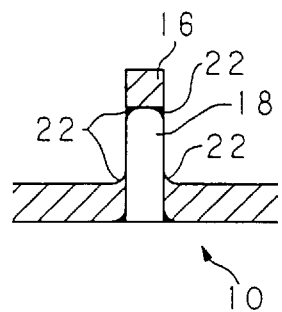
FIG. 10 is a view corresponding to FIG. 6 with the chassis having a burr (flush) on its installation portion.

With the installation portion 160 thus formed, the installation supporter 16 is molded after forming two parallel holes 20a and 20b, thereby making it possible to prevent burrs (flushes) from being formed on the side of installation supporter 16. When forming the installation supporter 16 through a process according to the conventional method, burrs 22 are formed on the side of installation supporter 16, as shown in FIG. 10 (corresponding to FIG. 6). Therefore, before actual use of the installation supporter 16 obtained through this conventional method, burr 22 had to be shaved off. The present invention allows the simple formation of a most preferable supporter 16 without incurring any inconveniences.

Furthermore, as the installation portion 160 exists only on the side where it holds the electric component of chassis 10 (printed plate board or cords, etc.), it is possible for the back face to remain flat without having any unnecessary protrusions.

Figure 11:
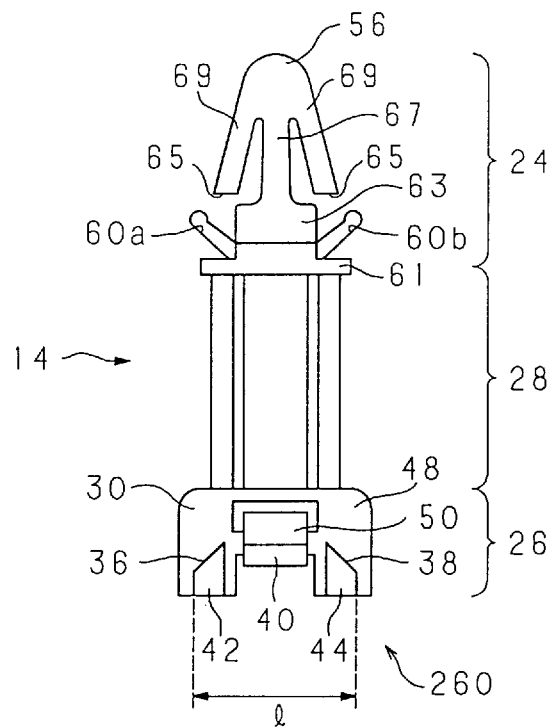
FIG. 11 is a front elevation of the electric component holder relating to an embodiment of the present invention.
Figure 12:
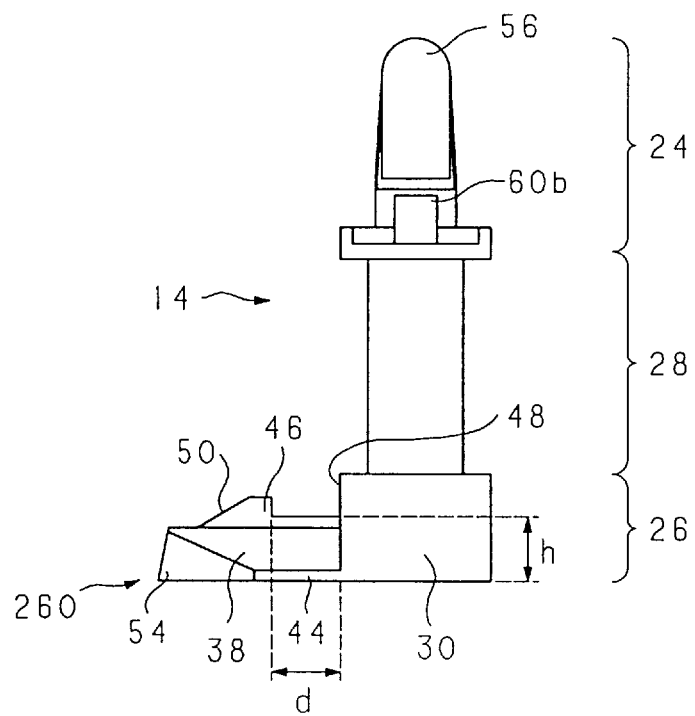
FIG. 12 is a side view of the electric component holder relating to an embodiment of the present invention.
Figure 13:
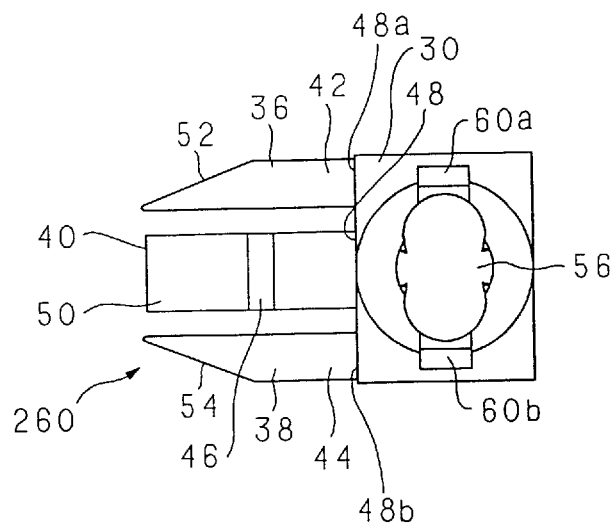
FIG. 13 is a planar view of the electric component holder relating to an embodiment of the present invention.

Now, the electric component holder 14 relating to an embodiment of the present invention will be described. FIG. 11 is a front elevation of the electric component holder 14 relating to the present embodiment, FIG. 12 is a side view, and FIG. 13 is a planar view of the holder in FIG. 11. In the terms of the present embodiment, the side of the electric component holder which at attachment to the chassis is at the side of the chassis shall be referred to as top and that which is at the side of the electric component shall be referred to as bottom.

The electric component holder 14 shown in FIGS. 11 through 13 comprises a securing portion 26 for securing the holder to chassis 10, a column 28 on the securing portion 26, and a holder 24 formed on the upper side of column 28 which holds the printed plate board.

Securing portion 26 comprises a substantially box-shaped body 30, and an engagement portion 260, which is provided on one side 48 of body 30, is inserted into said hole 18, and engages with the installation portion 160.

This engagement portion 260 comprises an engaging claw 40 extending from substantially the center of side 48, and guide pieces 42 and 44 extending from both sides of the engagement claws 40 of side 48.

Engagement claw 40 is provided at a position which is higher than bottom side 31 of the body 30 when the electric component holder 14 is being secured to chassis 10. This allows maintenance of a predetermined distance to the chassis 10 (cf. FIG. 11). As will be described below, this distance permits this engagement claw 40 to retire (to be pushed downwards) with side face 48 operating as a fulcrum when being inserted into hole 18, and to spring back after being inserted into hole 18. This engagement claw 40 further has a step 46 protruding from the tip thereof, and this step 46 is shaped as taper 50 where the width gradually becomes thinner in the direction of the tip of engagement claw 40. The portion from side 48 to this step 46 has a constant width, and the distance h from the upper face thereof to the bottom face of body 30 (cf. FIG. 12) is slightly longer than the distance H to the inner side of installation supporter 16 above (cf. FIG. 5). On the other hand, the length d from side 48 to the step 46 (cf. FIG. 12) are designed to correspond to the width D of installation supporter 16 (cf. FIG. 6).

Guide pieces 42 and 44 are the sides 48 of body 30, and are provided on both sides of the engaging claw 40 at a certain distance to the engagement claw 40. These guide pieces 42 and 44 are installed slightly inward from the sides of body 30, thereby forming guide pieces 42 and 44 and faces 48a and 48b between the sides of body 30. These guide pieces 42 and 44 have symmetrical shapes with the engagement claw thereinbetween, so that hereinafter, both shall be described together.

The tip of guide piece 42 (44) extends to the same position as the tip of engagement claw 40. This guide piece 42 (44) is made of the same material as engagement claw 40, and is able to approach and retreat from engagement claw 40 with the side face 48 operating as a fulcrum within the limits of the distance to said engagement claw 40. The distance l from the outer side end of guide piece 42 to the outer side end of guide piece 44 (cf. FIG. 11) is designed to be slightly longer than distance L (cf. FIG. 5) between the lower ends of installation supporters 16. The side face of guide piece 42 (44) distant to engagement claw 40 has formed thereon taper 36 (38) gradually inclining outward (in the direction going away from engagement claw 40) from the top to the bottom. This taper 36 (38) is designed as a shape corresponding to the inclined face 34 (cf. FIG. 5) formed on the inner side of installation supporter 16. As will be described below, this guide piece 42 (44) functions as a guide for the insertion into hole 18, and exerts pressure onto inclined face 34 after its insertion into hole 18. At the tip of guide piece 42 (44), taper 52 (54) is formed to incline in the direction where the outside side face of guide piece 42 (44) gradually approaches the engagement claw 40.

The above-mentioned holder 24 comprises a circular flange 61 on the upper end of column 28, an engaging column 63 which is formed on the center of the upper face of flange 61 and which has a smaller diameter than flange 61, a column 67 extending from the center of the upper face of the engaging column 63 to the upper direction, a pair of resilient engaging pieces 69 installed on the tip end of column 67 and extending downwards at an angle to the horizontal axis of the column 67, and resilient supporting pieces 60a and 60b on flange 61, which extend slantwise upwards and beyond the outer circumference of flange 61 on both sides.

The above mentioned column 67 forms together with the pair of resilient engaging pieces 69 an arrowhead-shaped insertion leg 56, and this component passes through installation hole 58 bored into printed plate board 12. The resilient engaging piece 69 is formed of resilient material, with both of its two free ends being able to move in the directions towards each other or away from each other about their upper portions as fulcrums. Furthermore, the free ends of resilient engaging pieces 69 form planar, free ends 65 which exercise pressure on one face of the printed plate board 12 (printed plate board 12 to be held by the holder 24) through which the inserted leg 56 has passed.

In contrast, the resilient supporting pieces 60a and 60b are formed to press the other face of the printed plate board 12 through which the inserted leg 56 has passed. These resilient supporting pieces 60a and 60b are formed of the same material as the resilient engaging pieces 69, and are made to turn slightly up and down about the side ends of column 63 as fulcrums. Thereby, they are applicable to a certain degree to printed plate boards 12 with different widths.

Accordingly, as resilient engaging pieces 69 are deformed to approach each other when insertion leg 56 passes through installation hole 58 of printed plate board 12, insertion leg 56 can easily be inserted into installation hole 58. In contrast, after insertion leg 56 passes through installation hole 58, resilient engagement pieces 69 recover from the deformation and exert pressure on the surface of printed plate board 12 with its free end 65. The other surface of this printed plate board 12 is supported by resilient supporting pieces 60a and 60b. In this way, printed plate board 12 can be held securely. As holder 24 is also arranged to have a desirable distance to chassis 10 through the column 28, printed plate board 12 is also held so as to have a desirable distance to chassis 10.

Referring now to the movement of securing the electric component holder 14 to the chassis 10, the tip of supporting portion 26 of electric component holder 14 (i.e., engagement claw 40 and guide pieces 42 and 44) is inserted into hole 18 of installation portion 160 of chassis 10. At this time, engagement claw 40 is deformed downward through tapered face 50 formed on the tip of engagement claw 40 and tapered faces 52 and 54 formed on the tips of guide pieces 42 and 44 with side 48 operating as a fulcrum, and guide pieces 42 and 44 are deformed to approach each other with side 48 operating as a fulcrum, thereby enabling simple insertion of these pieces into hole 18. Furthermore, tapered faces 36 and 38 of guide pieces 42 and 44 function at this time as insertion guides by sliding along the inner inclined face 34 of installation supporter 16.

Next, engagement claw 40 and guide pieces 42 and 44 are inserted until installation supporter 16 is positioned between step 46 and side face 48. In this state, engagement claw 40 is pressed on the top part of the inner wall of installation supporter 16 through recovery from said deformation. The reason is that in this state, distance h from the upper face of engagement claw 40 to the bottom face of body 30 (cf. FIG. 12) is designed to be slightly higher than distance H to the above-mentioned inner wall of installation supporter 16 (cf. FIG. 5).

Installation supporter 16 is also clamped between step 46 of engagement claw 40 and side face 48 of body 30. In contrast, guide pieces 42 and 44 also recover from said deformation, and tapered faces 36 and 38 are pressed against inclined face 34 of installation supporter 16. The reason is that even in this state, distance 1 from the outer side end of guide piece 42 to the outer side end of guide piece 44 (cf. FIG. 11) is designed to be slightly longer than distance L between the bottom ends of installation supporter 16 (cf. FIG. 5).

In this way, electric component holder 14 is secured to chassis 10 in a balanced state in a simple and secure manner. Accordingly, electric component holder 14 does not shake or rotate around an axis perpendicular to the surface of chassis 10. Therefore, it is possible to maintain the electric component in one constant mounting direction.

On the other hand, when removing the electric component holder 14 from the installation portion 160, it is possible to remove the electric component holder from chassis 10 in a simple manner by pressing step 46 of engagement claw 40 downward and at the same time pulling out the whole electric component holder 14, thereby causing guide pieces 42 and 44 to deform to mutually approach each other. This also offers the advantage that the electric component holder is easily removed from chassis 10 for the performance of recycling of appliances and materials.

As described above, the present embodiment of electric component holder 14 forms no protrusion on the back face of chassis 10, enabling it to be securely fastened to chassis 10. As there is no need to allow extra space for the protrusion on the back face of chassis 10, electric appliances can be made more compact. Furthermore, the outward appearance of the electric device is not materially damaged by the protrusion, and there is no danger of workers scratching their hands or hurting themselves while conducting maintenance inside the device. Additionally, the problem of the electric component holder getting bent by a maintenance worker is reduced or eliminated.

As the shape of holder 24 can be set arbitrarily and there is no need to consider the width of chassis 10, it is possible to enhance the generality of electric component holder 14.

Now, another embodiment of the present invention will be described with reference to the drawings. The same reference numerals used to describe the embodiment above shall be used to indicate the same portions of the embodiment shown below, without further explanation.

Figure 14:
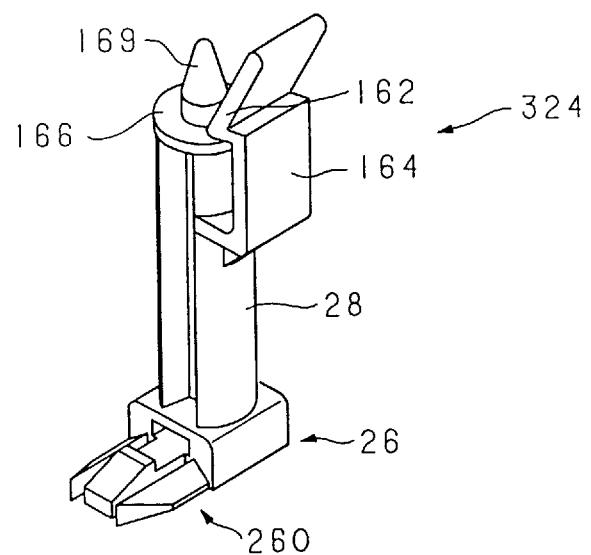
FIG. 14 is a perspective view of an electric component holder relating to another embodiment of the present invention.

The electric component holder indicated in FIG. 14 is for holding printed plate boards. The holding portion 324 of this electric component holder comprises a circular flange 166 formed on the top of column 28, a conical protrusion 169 formed on to a flange 166, an arm member 164 extending upward in the longitudinal direction from substantially the center of column 28, and an engaging operator 162 which is made of the same material as arm member 164 while being formed on the upper end of arm member 164 to contact flange 166.

When a printed plate board is held by the holding portion 324, engagement operator 162 is turned down in the direction away from protrusion 169, thereby opening the flange 166 portion which was in contact with the engagement operator 162. Then, protrusion 169 is passed through the installation hole opening into the printed plate board (not shown), and a portion of the printed plate board is placed on top of flange 166. Thereafter, engagement operator 162 is turned back to press the top face of the printed plate board.

In contrast, when removing the printed plate board from holder 324, engagement operator 162 is again turned down and away from protrusion 169, and the printed plate board need only be pulled out from protrusion 169.

Figure 15:
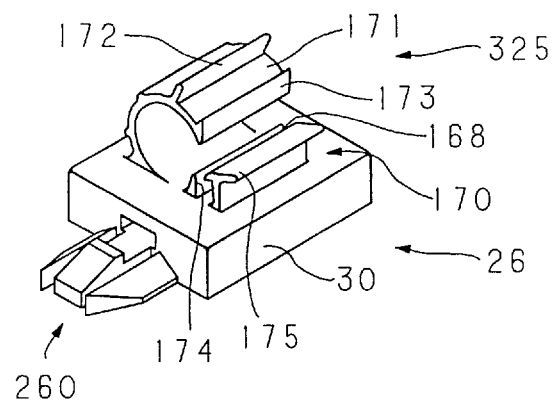
FIG. 15 is a perspective view of an electric component holder relating to another embodiment of the present invention.

The electric component holder shown in FIG. 15 is for holding a wire able with circular cross-section. This electric component holder has been provided directly with holder 325 without having column 28 on top of securing portion 26. This securing portion 26 and holding portion 325 may be formed as one body.

This holding piece 325 comprises a C-shaped resilient belt 171 on top of securing portion 26, and engaging portion 170 positioned to be engagable with the free end of resilient belt 171 on top of securing portion 26.

The above-mentioned resilient belt 171 has formed thereon a clamping operating piece 172 which protrudes from approximately the middle of the outer side, and at the free end, an L-shaped engaging tooth 173 is mounted.

The above-mentioned engaging portion 170 comprises a pressing piece 174 placed opposite the free end of resilient belt 171 so as to be able to press the free end of resilient belt 171, and an engagement claw at a predetermined distance from this pressing piece. The gap existing between these two form an insertion slot 168 for insertion of the engagement piece 175.

When holding a cable with this holding portion 325, the desired number of cables (a bundle of cables) are first inserted into belt-shaped body 171, then, while pressing and widening the engagement claw 175 outward by pressing clamp operating piece 172 downwards, the free end of belt-shaped body 171 is pressed into insertion slot 168, and the cable bundle is fixed by engaging the L-shaped engaging tooth 173 with engagement claw 175.

When removing the cable bundle from holding portion 325, engagement claw 175 is pressed downward, by pressing and widening insertion slot 168, the L-shaped engagement tooth 173 is released from engagement claw 175, and the free end of resilient belt 171 need only be pulled out from insertion slot 168.

Figure 16:
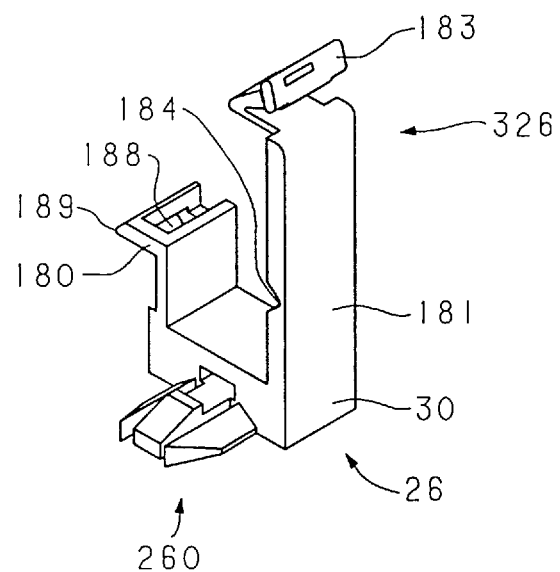
FIG. 16 is a perspective view of an electric component holder relating to another embodiment of the present invention.

The electric component holder shown in FIG. 16 is for holding flat cables with a rectangular cross section. This electric component holder has directly thereon a holder 326 without having column 28 on top of the securing portion 26. This securing portion 26 and holding portion 326 may be formed as one body.

This holding portion 326 comprises a resilient, substantially U-shaped body which is mounted on top of securing portion 26 and an engaging portion 180 positioned engagably with the free end of resilient body 181 on top of securing portion 26.

The above-mentioned resilient body 181 has provided thereon a cutout 184 around the middle in its longitudinal direction so as to enable the resilient body 181 to be bent inward at substantially 90 degrees. An L-shaped engaging tooth 183 is also provided on the free end of resilient body 181.

The above-mentioned engaging portion 180 comprises an insertion hole 188 through which the free end of resilient body 181 is to be passed, and an engaging piece 189 which engages with the L-shaped engaging tooth 183 of the free end passed through insertion hole 188.

When holding cables with this holding portion 326, a desired number of cables (bundle of cables) are first inserted into a belt-like body 181, then the belt-like body 181 is bent inward at substantially 90 degrees with cutout 184 as fulcrum and caused to approach the free end of belt-like body 181. Then, the free end of belt-like body 181 is inserted into insertion hole 188, and L-shaped engaging tooth 183 is engaged with engaging piece 189 to fix the bundle of cables.

When removing the cable bundle from the holding portion 326, the engagement between engaging piece 189 and L-shaped engaging tooth 183 is released and the free end of resilient body 181 need only be pulled out from insertion hole 188.

Figure 17:
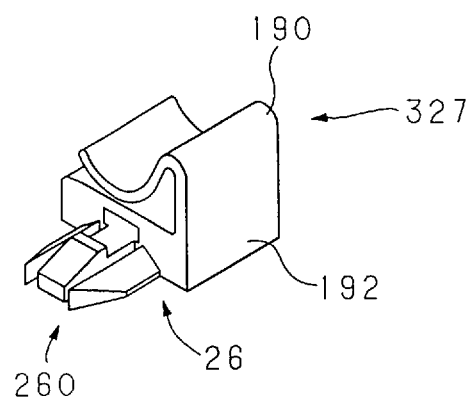
FIG. 17 is a perspective view of an electric component holder relating to another embodiment of the present invention.

The electric component holder shown in FIG. 17 is for holding flat cables with rectangular cross section. This electric component holder has holding portion 327 directly thereon without having a column 28 on top of the securing portion 26, and is basically for holding one flat cable. This securing portion 26 and holding portion 327 may be formed as one body.

This holding portion 327 comprises an arm 192 on top of securing portion 26 in a standing state, and a circular, downwards arc-shaped resilient body 190 provided at the tip end of arm 192. This resilient body 190 is positioned so that its substantially central portion contacts the upper face of securing portion 26, or so that a gap slightly exists between such substantially central portion and the upper face of securing portion 26, thereby enabling the gap formed between the substantially central portion of resilient body 190 and the upper face of securing portion 26 to be adjusted via its resilient force.

When holding flat cables with this holding portion 327, the free end of resilient body 190 is pressed upward, the gap between the upper face of securing portion 26 and resilient body 190 is pressed wider, and a flat cable is inserted into this gap. Then, when releasing the free end of resilient body 190, resilient body 190 springs back toward the securing portion 26 through its restoring force, and the flat cable is fixed by pressure.

When removing the flat cable from holding portion 327, the free end of resilient body 190 is pushed upward, the gap between upper face of securing portion 26 and resilient body 190 is pressed wider, whereby the flat cable inserted into this gap only needs to be pulled out.

Figure 18:
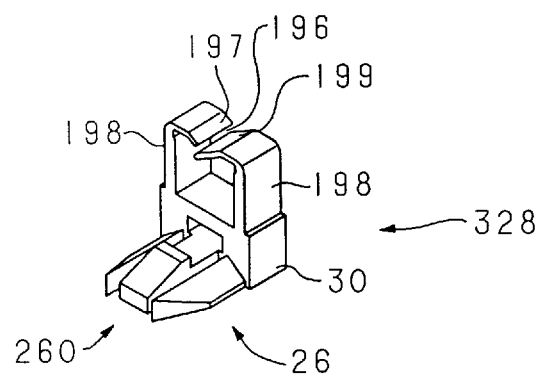
FIG. 18 is a perspective view of an electric component holder relating to another embodiment of the present invention.

The electric component holder shown in FIG. 18 is for holding a cable with a substantially quadrangular cross section. This electric component holder has directly mounted thereon holding portion 328 without having a column 28 on top of securing portion 26. This securing portion 26 and holding portion 328 may be formed as one body.

This holding portion 328 is made of a resilient body 198 having a substantially quadrangular shape with the central upper portion open, and both ends of this resilient body 198 have projections 197 and 199 projecting slantwise in the inward direction.

When holding cables with this holding portion 328, resilient body 198 is turned slightly in a direction to press the opening 196 wider, and the cable is inserted into the opening 196 opened into the central top portion of holding portion 328. As projection 197 is resiliently deformed at both sides through its resilient force, and presses the opening 196 even wider, the cable can be inserted very easily. After insertion of the cable, projection 328 springs back and opening 196 becomes narrower, so that the held cable is prevented from being removed from this portion.

When the cable is to be removed from holding portion 328, resilient body 198 is slightly turned in the direction to press the opening 196 wider, then opening 196 opened into the central top portion of holding portion 328 is pressed wider, so that the cable only needs to be pulled out therefrom.

Figure 19:
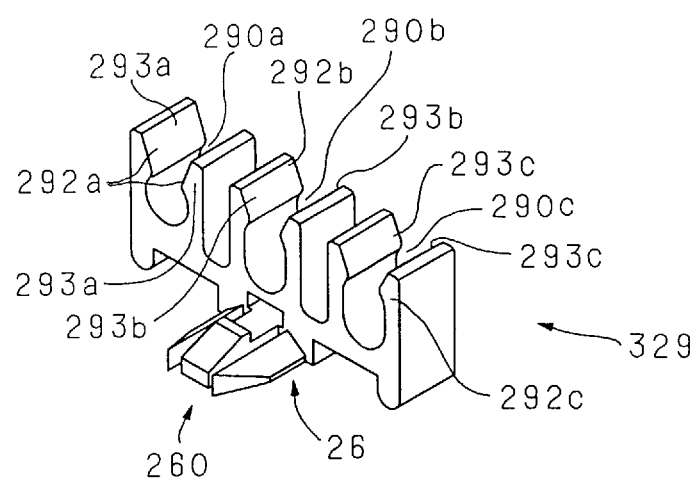
FIG. 19 is a perspective view of an electric component holder relating to another embodiment of the present invention.

The electric component holder shown in FIG. 19 is for holding cables with circular cross sections. This electric component holder has directly mounted thereon holding portion 329 without having a column 28 on top of the securing portion 26, and is for holding 3 separate cables. This securing portion 26 and holding portion 329 may be formed as one body.

This holding portion 329 has mounted thereon in one row resilient bodies 292a, 292b and 292c which have substantially the shape of a "C" opening upward on the top of securing portion 26. These resilient bodies 292a through 292c have tapered faces 293a, 293b and 293c which widen outward on both ends, respectively.

When holding cables with this holding portion 329, tapers 293a, 293b and 293c formed on both upper ends of resilient bodies 292a through 292c contact the cables, which are subsequently pressed downward, and pushed inside openings 290a through 290c opened into the top of resilient bodies 292a through 292c. At this time, resilient bodies 292a through 292c deform resiliently via their resilient forces in the direction to press openings 290a through 290c wider, so that the cables can be easily inserted. Furthermore, after insertion of the cables, resilient bodies 292a through 292b spring back, narrowing openings 290a through 290b, thereby preventing the held cables from falling out of this portion.

When the cables are to be removed from this holding portion 329, they only need to be pulled upward, so that resilient bodies 292a through 292c press and widen openings 290a through 290c via their resilient forces, enabling the cables to be easily removed.

Furthermore, it is obvious that with these embodiments, the number of installed resilient bodies can be set arbitrarily.

Figure 20:
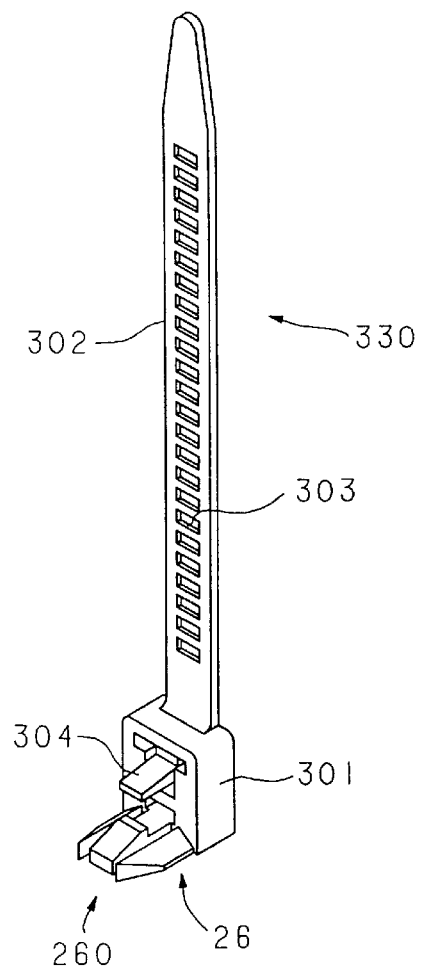
FIG. 20 is a perspective view of an electric component holder relating to another embodiment of the present invention.

The electric component holder shown in FIG. 20 is for holding a comparatively large number of cables. This electric component holder has directly provided thereon a holding portion 330 on the top of securing portion 26, without having a column 28. This securing portion 26 and holding portion 330 may be formed as one body.

This holding portion 330 comprises a main holding body 301 provided on securing portion 26, and a resilient belt 302 provided on top of main supporting body 301. This resilient belt 302 has a plurality of independent, parallel bores 303 provided along the lengthwise direction thereof. In contrast, main supporting body 301 is provided with engaging protrusion 304 sized corresponding to said bore 303, and structured to engage both by inserting this engagement protrusion 304 into any one of the bores 303.

When holding cables with this holding portion 330, the desired number of cables are wound by resilient belt 302 and the engaging protrusion 304 is inserted into and engages with the bore 303 which is at the most preferable position for the diameter of this bundle.

In contrast, when removing the cable from holding portion 330, the engaging protrusion 304 and bore 303 are disengaged, and engaging protrusion 304 need only be pulled out from bore 303.

Figure 21:
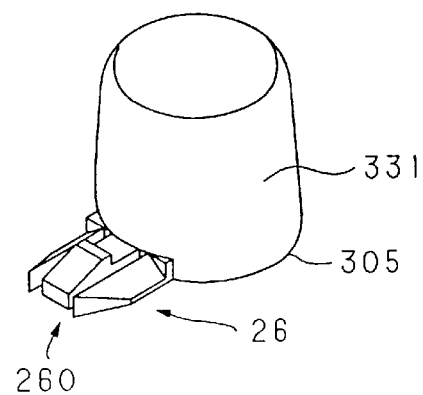
FIG. 21 is a perspective view of an electric component holder relating to another embodiment of the present invention.
Figure 22:
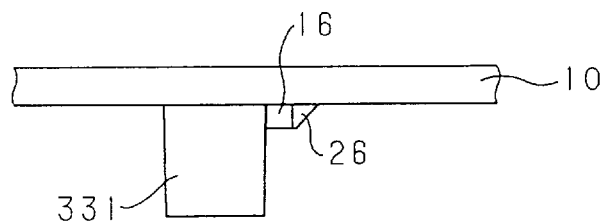
FIG. 22 is a side view of an electric component holder relating to another embodiment of the present invention.

The electric component holder shown in FIG. 21 is for use as a leg for electric equipment. This electric component holder has directly mounted thereon at the securing portion 26 a modification of the holding portion, namely a portion 331 which is to be a leg of an electric device. The face 305 of this leg component 331 on the side of securing portion 26 is positioned on the same surface as the bottom face of securing portion 26. As shown in FIG. 22, this electric component holder is provided so that the face 305 contacts the outside bottom surface of the electric device.

Figure 23:
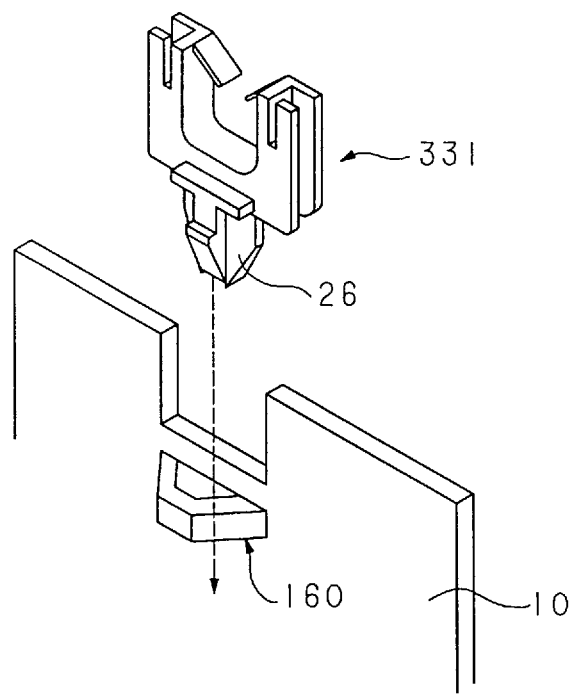
FIG. 23 is a perspective view of an electric component holder relating to another embodiment of the present invention.

Furthermore, the electric component holder relating to the present embodiment may have a holder on securing portion 26 in the insertion direction of the electric component holder, as shown in FIG. 23. In this case, the holder may engage with chassis 10, as shown in FIG. 23.

The securing portion of the electric component holder shown in FIGS. 24 through 31 merely has a different construction in comparison to the electric component holder shown in FIG. 16. Therefore, a detailed explanation will be omitted by indicating the portions of the holding portion with the same reference numerals as in FIG. 16, and limiting the description to the structure of the securing portion. The electric component holder relating to the present embodiment is formed from the same resilient material with restorative character, as in the embodiment described above.

Figure 24:
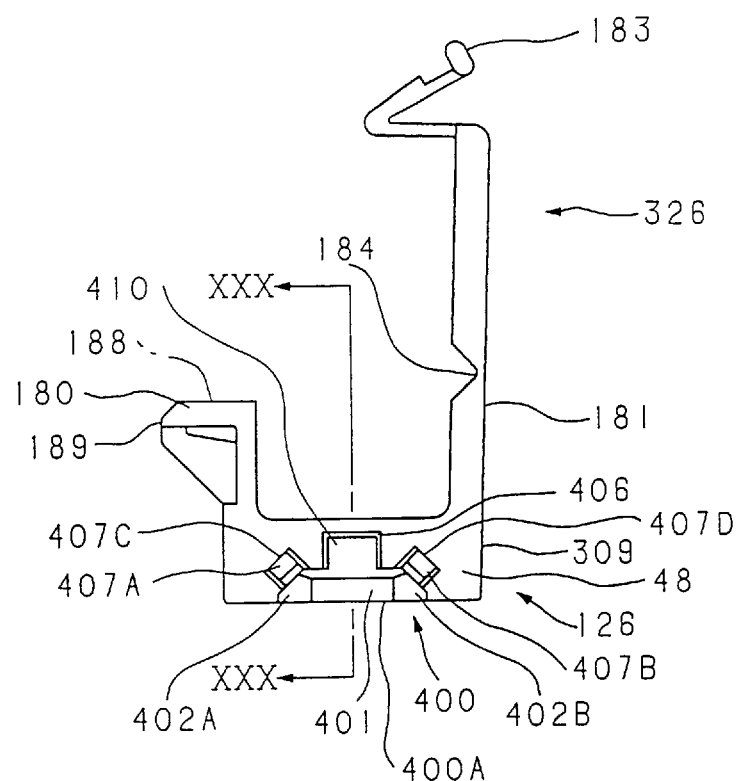
FIG. 24 a front elevation of an electric component holder relating to another embodiment of the present invention.
Figure 25:
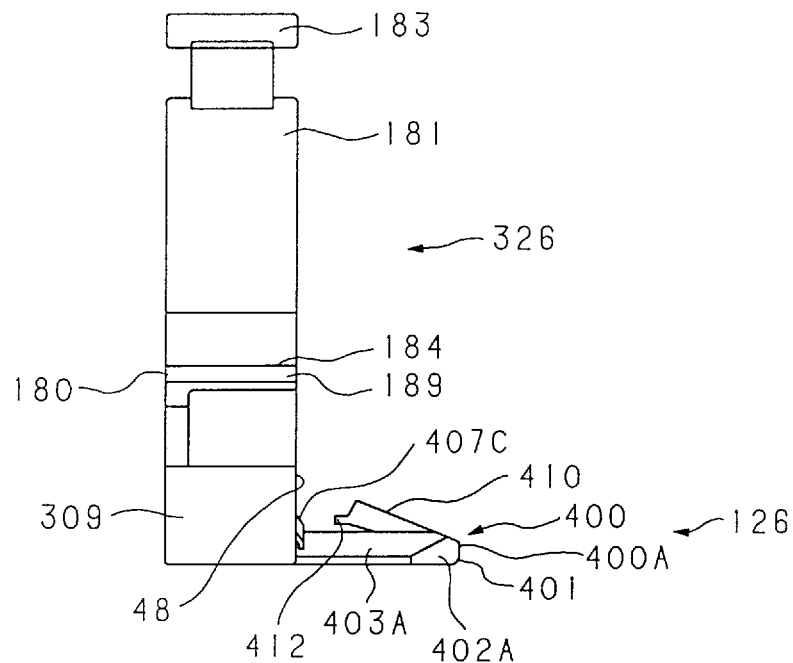
FIG. 25 is a left side view of the holder in FIG. 24.
Figure 26:
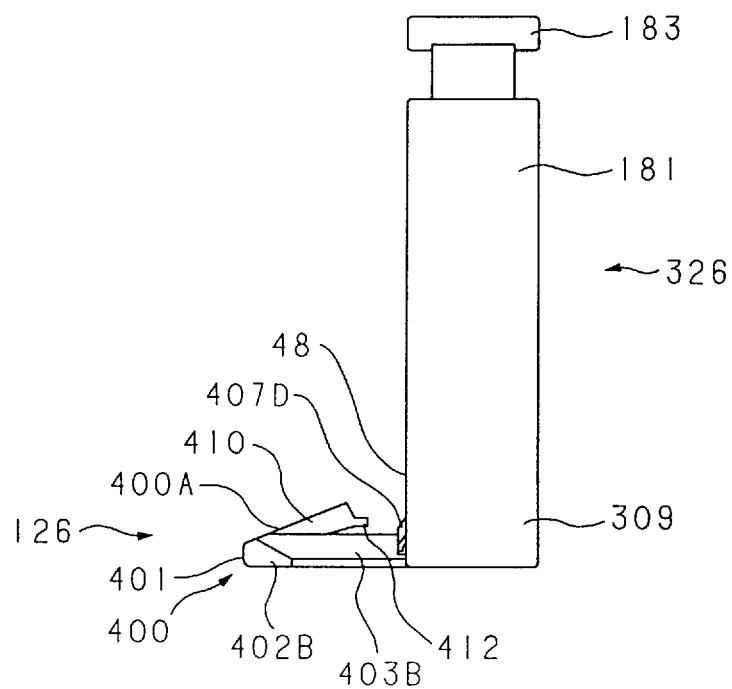
FIG. 26 is a right side view of the holder in FIG. 24.
Figure 27:
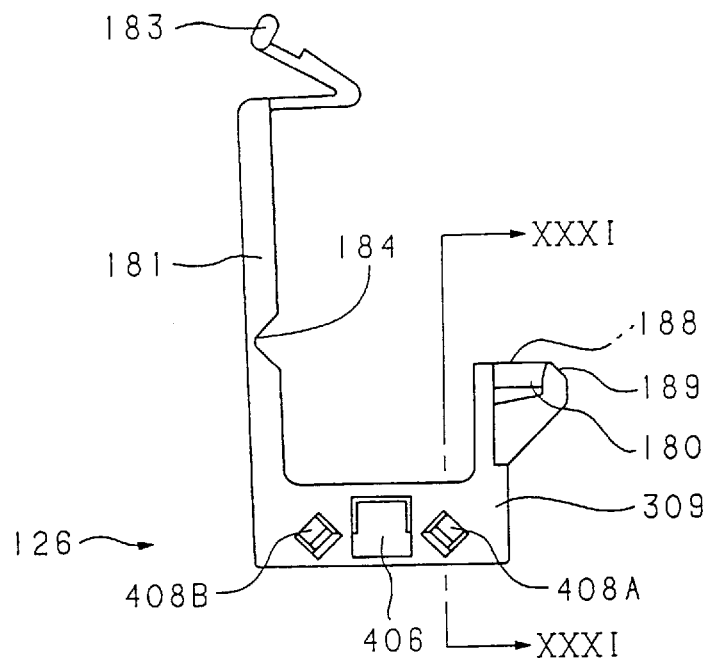
FIG. 27 is a back side view of the holder in FIG. 24.
Figure 28:
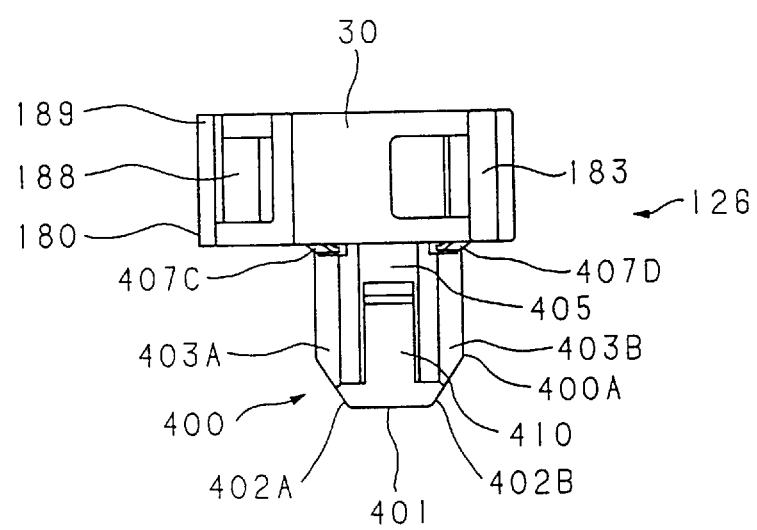
FIG. 28 is a planar view of the holder in FIG. 24.
Figure 29:
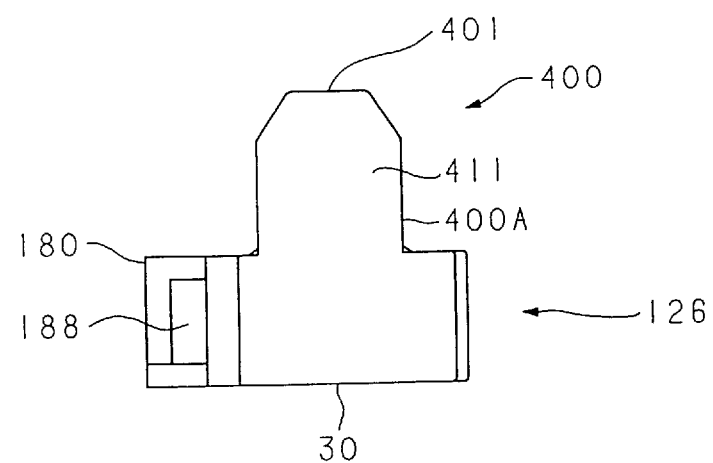
FIG. 29 is a bottom view of the holder in FIG. 24.
Figure 30:
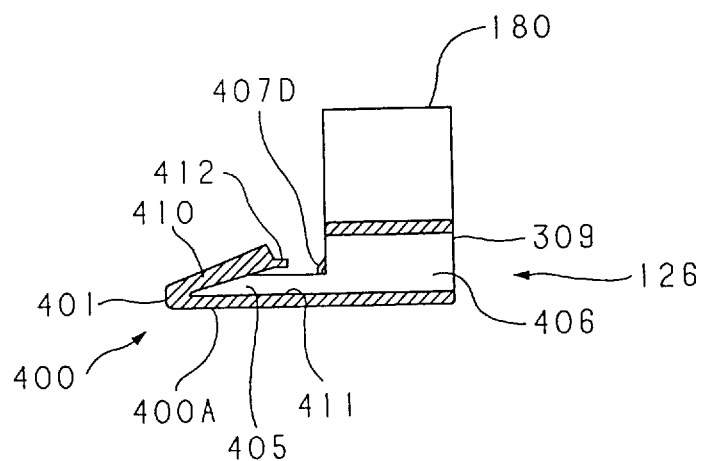
FIG. 30 is a sectional view of the holder in FIG. 24 along line XXX—XXX.
Figure 31:
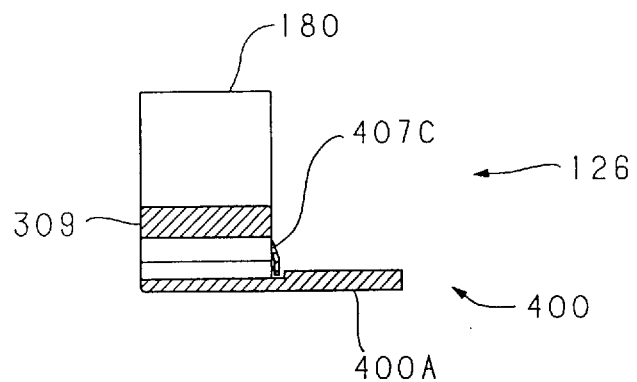
FIG. 31 is a sectional view of the holder in FIG. 27 along line XXXI—XXXI.

FIG. 24 is a front view, FIG. 25 is a left side view, FIG. 26 is a right side view, FIG. 27 is a back side view, FIG. 28 is a planar view, and FIG. 29 is a bottom side view of the present embodiment, FIG. 30 is a cross section of the embodiment in FIG. 24 along line XXX—XXX, and FIG. 31 is a cross section of the embodiment in FIG. 27 along line XXXI—XXXI.

The electric component holder shown in FIGS. 24 through 31 is composed of a securing portion 126 and a holding portion 326 formed integrally on top of the securing portion 126.

Securing portion 126 includes a substantially box-shaped, body 309 and an engaging portion 400 provided on one side 48 of the body 309 and formed passable through hole 18 of the above-mentioned installation portion 160.

Body 309 has formed thereon at substantially the center of engaging portion 400 a bore 406 bored through in the direction of insertion and removal. Furthermore, the side face 48 of body 309 is provided at both sides of bore 406 with pressing portions 407A and 407B, which press the outer wall of installation supporter 16 of installation portion 160 towards the tip of engagement portion 400.

These pressing portions 407A and 407B have a substantially square shape in a slanted position along the shape of installation supporter 16, and are formed by cutting out side 48 of body 309 in a U-shape, leaving out the upper sides 407C and 407D. These pressing portions 407A and 407B protrude slightly from the upper sides 407C and 407D towards their tips in the insertion direction of engaging portion 400 with regard to side 48. Pressing portions 407A and 407B have bored therein at their back sides holes 408A and 408B corresponding to the shapes of pressing portions 407A and 407B. The existence of these holes 408A and 408B adjust pressing portions 407A and 407B to become thinner. Through this shape, pressing portions 407A and 407B function as "springs" with sides 407C and 407D as fulcrums. Accordingly, the outer wall of installation supporter 16 arranged on side 48 is pressed in the direction of insertion of engaging portion 400, thereby holding installation supporter 16 securely.

Engaging portion 400 has substantially the shape of a board protruding vertically to one side 48 of body 309, and tip 401 thereof has formed thereon tapers 402A and 402B focusing towards the center line of insertion direction of this engaging portion 400. Furthermore, on both sides of engaging portion 400, tapers 403A and 403B are formed with shapes corresponding to the shape of inclined face 34 of hole 18 of installation portion 160, in continuation of tapers 402A and 402B. Through the existence of tapers 402A, 402B, 403A and 403B, engaging portion 400 can be easily inserted into hole 18 of installation portion 160.

Recess 405 is formed at the center of engaging portion 400, and this recess 405 continues into bore 406. The existence of this recess 405 enables the forming of the most preferable space for pressing engaging claw 410 downwards with tip 401 operating as a fulcrum between the engaging claw 410, which is described below, and bottom face 411 of engaging portion 400.

At the center of tip 401 of engaging portion 400, engaging claw 410 is provided, which extends upward inclining toward the body 309, with such center of the tip 401 operating as a fulcrum. The tip of this engaging claw 410 extends to the position of the outer wall of the upper portion of installation supporter 16, and protrusion 412 is formed on the tip portion. This projection 412 holds installation portion 16 securely by engaging it with the inner wall of the upper portion of installation supporter 16 with pressure. Here, a space as shown especially in FIG. 30 is formed between engaging claw 410 and bottom face 411 of engaging portion 400. This space makes it possible to press the engaging claw 410 toward the bottom face 411 with this tip portion 401 operating as a fulcrum. When relieved of this downward pressure, engaging claw 410 recovers and springs back to the initial state. As the tip portion 401 operates as a fulcrum when forcing the engaging claw 410 downward, bottom face 411 is also slightly resiliently deformed, so that engaging claw 410 is forced downward even more easily. Engaging portion 400 is easily inserted into hole 18 of installation portion 160 through movement in a substantially vertical direction with regard to the bottom surface 411 of this engaging claw 410, and after insertion, the initial state is restored through the recovery of this engaging claw 410, so that the end of engaging claw 410 supports the outer wall of installation supporter 16, and projection 412 supports the inner wall of the upper portion of installation supporter 16, thereby securely holding installation supporter 16. At this time, pressing portions 407A and 407B as described above exert pressure on the outer wall of installation supporter 16, so that installation supporter 16 is fixed even more securely.

Referring now to the movement of installing this electric component holder on chassis 10, the tip portion 401 of engaging portion 400 of the electric component holder is first inserted into hole 18 of installation portion 160. This engaging portion 400 is easily inserted into hole 18 due to the existence of tapers 402A and 402B, the pressing down of engaging claw 410 contacting the inner wall of the upper portion of hole 18 with tip portion 401 operating as a fulcrum, and the tapers 403A and 403B sliding in contact with and along the inclined face 34 on the inner side of installation supporter 16.

Thereafter, engaging portion 400 is inserted until installation supporter 16 is positioned between the tip end of engaging claw 410 and side face 48 of body 309. At this state, engaging claw 410 is relieved from the state of being pressed down, recovers from the resilient deformation and takes the initial position again, thereby pressing the outer wall of upper portion of installation supporter 16, while projection 412 supports with pressure the inner wall of upper portion of installation supporter 16. Pressing portions 407A and 407B press the outer wall of installation supporter 16. Accordingly, securing portion 126 securely supports installation supporter 16 from both sides in direction of insertion and removal of engaging portion 400, thereby being securely attached to installation portion 160. Therefore, the electric component holder does not shake or fall off from installation portion 160 even when chassis 10 vibrates.

On the other hand, when removing this electric component holder from chassis 10, removal is conducted easily by pressing engagement claw 410 downward and moving securing portion 126 in the direction of removal.

This embodiment was described to be structured as tapers 402A and 402B formed on the tip 401 of engaging portion 400, but tapers 402A and 402B need not necessarily be formed.

This embodiment further had tapers 403A and 403B formed on both sides of engaging portion 400, but this is not a limitation, and they need not be formed. As the shape of the hole 18 is a trapezoid in this embodiment, tapers 403A and 403B were formed in correspondence with inclined face 34 of hole 18 on both sides of engaging portion 400, but this is not a limitation, and tapers 403A and 403B are unnecessary according to the shape of hole 18.

Furthermore, in the present embodiment in both sides of the side face 48 of bore 406 provides pressing portions 407A and 407B. However, not being limited to this, as illustrated in FIGS. 34 through 36, it is possible to have the pressing portion 507 extending slantingly downward to the engagement portion 400 in the upper center of side 48. In such case, in place of bore 406, the securing position 126 has formed thereon at the bottom of securing portion 126 with bores 506A and 506B bored through. This pressing portion 507 is comprised together with the securing portion body 309, and its fulcrum at the end functions as a "spring."

Furthermore, although the present embodiment was described as an electric component holder with a structure combining securing portion 126 and the holder 326 in FIG. 16, securing portion 126 may be combined with the holding portion in FIG. 11 or in any one of the holding portions in FIGS. 14 through 21.

By further forming the securing portion 126 and the various holders above integrally, the strength of the electric component holder can be promoted even more.

The electric component holder relating to the present embodiment can also be applied to forms shown in FIG. 23.

Figure 32:
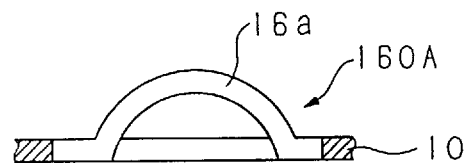
FIG. 32 is a front elevation of the attachment portion relating to another embodiment of the present invention.
Figure 33:
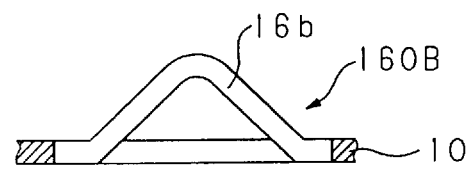
FIG. 33 is a front elevation of the attachment portion relating to another embodiment of the present invention.

Aside from the shape explained with the embodiment above, the installation portion according to the present invention may be shaped as desired, for example like the installation portion 160A including a circular arc-shaped installation supporter 16a, as shown in FIG. 32, or the installation supporter 160B including a substantially triangular installation portion 16b, as shown in FIG. 33. In this case, the shape of the securing portion of electric component holder is naturally designed together with each of the installation portions.

Although the present embodiment used printed plate boards and cables, etc. as the electric component, this is not a limitation, and other electric components may be held by changing the shape of the holder.

As has been explained above, the present invention enables electric components such as printed plate boards or cables, etc. to be easily released and securely fixed with simple operation to a receiving member without leaving a portion of the electric component holder protruding from the back face of the receiving member. As result, there is no need to leave space for the protrusion on the back face of the receiving member, as with the conventional art, making it possible to make electric appliances compact. Furthermore, as no protrusions harm the outward appearance of the electric device, it is possible to enhance the merchandise value of the electric device. As said protrusion does not exist, the maintenance inside the device can be conducted safely, and problems of bending the electric equipment holder and the like can also be solved.

As the shape of the holding portion can be set freely, there is no need to take the width of the receiving member into consideration, offering the advantage of promoting the generality of the electric component holder greatly.

As the electric component holder relating to the present invention can be attached and released to the receiving member in a simple manner, adaptability to recycling can be advanced. As it also does not shake or rotate about a vertical axis with regard to the receiving member face when it is mounted on the receiving member, the electric component can be positioned so as to maintain one direction.

Forming the securing portion with the holding portion integrally further offers a reinforced electric component holder.

What is claimed is:

1. An electric component holder to be secured to a receiving member comprising:

a holding means for holding an electric component, and a securing portion for securing the holding means to said receiving member, said securing portion including a body and an engaging portion on said body, said engaging portion being releasably engaged with an installation portion formed on only one face of the receiving member.

2. An electric component holder according to claim 1 further comprising a combining member positioned between said holding means and said securing portion to combine both at a predetermined distance.

3. An electric component holder according to claim 1, wherein said holding means is formed integrally with said securing portion.

4. An electric component holder to be secured to a receiving member comprising:

a holding means for holding an electric component, and a securing portion for securing said holding means to said receiving member, said securing portion including a body and an engaging portion on said body, said engaging portion being releasably engaged with an installation portion formed on one face of said receiving member;

wherein said installation portion includes a hole open in a direction parallel to said face of said receiving member and said engaging portion is inserted in said hole.

5. An electric component holder according to claim 4, wherein said engaging portion has an engaging claw at its tip, the engaging claw retiring when inserted into said hole and recovering when extending past the hole to engage with said installation portion.

6. An electric component holder according to claim 5, wherein said engaging claw retires and recovers resiliently with the base end of said engaging portion as fulcrum.

7. An electric component holder according to claim 5, wherein said engaging portion has guide pieces on both sides of said engaging claw which project in a horizontal direction from that face of said body which has the engaging portion thereon, such guide pieces guiding the engaging portion during insertion into said hole, and exerting pressure on the inner wall of said installation portion when such engaging portion has engaged with the installation portion.

8. An electric component holder according to claim 5, wherein said engaging portion comprises an engaging portion body extending in a horizontal direction from said body, and wherein said engaging claw extends upward at a narrow angle from the tip end to the base end of the engaging portion body, is made from the central portion in a widthwise direction of the engaging portion body, and retires or recovers resiliently with the tip of the engaging portion body operating as a fulcrum.

9. An electric component holder according to claim 8 further comprising a pressing portion on that face of said body which has the engaging portion thereon, which exerts pressure on the outer wall of said installation portion in the direction of said engaging claw.

10. An installation portion for installing an electric component holder on a receiving member, comprising:
  an installation supporter formed on the receiving member to project in a substantially vertical direction to the front face of the receiving member, and which defines together with the surface of the receiving member a first hole open in one direction parallel to the surface, and
  a second hole bored at a position opposite to said installation supporter of the receiving member, the second hole being formed to extend over both sides of the installation supporter in the direction in which it opens.

11. A mechanism for securing an electric component holder, comprising:
  an electric component holder for holding an electric component, and
  a receiving member whereon the electric component holder is secured, the receiving member including an installation supporter formed to project in a substantially vertical direction to the front face of the receiving member and which defines together with the front face of the receiving member a first hole open in one direction parallel to the front face, and a second hole bored at a position opposite to said installation supporter of the receiving member and extending over both sides of the installation supporter in the direction in which it opens,
  wherein said electric component holder includes an engaging portion which is releasably inserted into said first hole in the direction parallel to the receiving member face to be pressed by the inner wall of the installation supporter and which thereby engages with the installation supporter to be releasable in the insertion direction.

* * * * *